United States Patent [19]

Shintaku

[11] 4,190,511
[45] Feb. 26, 1980

[54] METHOD OF MANUFACTURING AN INTERNAL MIRROR TYPE GAS LASER TUBE

[75] Inventor: Keiichi Shintaku, Tokyo, Japan

[73] Assignee: Nippon Electric Co., Ltd., Tokyo, Japan

[21] Appl. No.: 943,611

[22] Filed: Sep. 19, 1978

[51] Int. Cl.$^2$ .............................................. C23C 15/00
[52] U.S. Cl. ...................... 204/192 P; 331/94.5 G; 316/5; 316/7; 316/9; 316/13
[58] Field of Search .................. 204/192 P, 192 R; 331/94.5 G; 316/5, 7, 9, 13

[56] References Cited

U.S. PATENT DOCUMENTS

| 3,516,009 | 6/1970 | Lipsett | 331/94.5 |
| 3,562,664 | 2/1971 | Ridgen et al. | 31/94.5 |
| 3,899,751 | 8/1975 | Hochuli | 331/94.5 |
| 4,093,349 | 6/1978 | Mills | 204/192 P |

Primary Examiner—John H. Mack
Assistant Examiner—William Leader
Attorney, Agent, or Firm—Hopgood, Calimafde, Kalil, Blaustein & Lieberman

[57] ABSTRACT

A metallic member is disposed in the vicinity of a mirror within an internal mirror type gas laser tube, and an electric discharge is excited between an internal laser anode and the metallic member. The metallic member serves as a cathode to sputter the metal of the metallic member onto the surface of the internal mirror. The metal adheres to the surface of the mirror and forms a metallic film thereon. The output power of the lower tube is monitored during the sputtering process and the sputtering process is terminated when the output power is reduced to a desired output power value.

4 Claims, 2 Drawing Figures

METHOD OF MANUFACTURING AN INTERNAL MIRROR TYPE GAS LASER TUBE

BACKGROUND OF THE INVENTION

The present invention relates to a method for manufacture of an internal mirror type gas laser tube, and more particularly, to a method of controlling the output power of such gas laser tubes.

It has recently become possible to manufacture an internal mirror type gas laser tube which is small in size and yet has a high power output. Such manufacture is a result of progress in the laser techniques and an improvement in the method of manufacturing the laser tube. The application for lasers of this type has also expanded from experimental use, in the past, to industrial use such as in point of sale (POS), terminals video disks, etc. In the past, laser output was required to be coherent light having an output power higher than certain values such as 1 mW or 2 mW. However, in industrial applications such as POS terminals, video disks, or the like, in addition to the requirement for coherent light, a fairly severe restriction on deviation of laser power output value is imposed on industrial laser products. This is especially true in view of the fact that a large number of such products should have the same or similar characteristics.

The outputs of known practically mass-produced laser tubes show a normal distribution curve about a predetermined output value at the center of the curve. As a result known manufactured laser tubes have a considerably large deviation in power output. Accordingly, in a case where a predetermined value, or a value within a narrow range is required for laser outputs, product yield is generally unsatisfactory.

One approach to obtain a required rated output power has included a method wherein the center of the normal distribution of the laser output is designed to be somewhat higher than the desired rated output. A filter, having an appropriate transmission rate, is mounted outside of the laser tube and reduces the output power to the desired rated output. However, this method has drawbacks in that many kinds of filters, having different transmission rates, are required in order to cover different output values and a structure for mounting the filter is also required. The result is an increase in the cost of the tube and in the work necessary to select a filter having an appropriate transmission rate. These factors decrease mass-producibility.

SUMMARY OF THE INVENTION

It is an object of the present invention to provide a method of manufacturing inexpensive laser tubes, suitable for mass-production, which have a small random variation in power output suitable for mass-production.

Another object of the invention is to provide a novel method of obtaining a desired output power of a laser tube by readily reducing the output power to the desired value.

According to the present invention, there is provided a method of manufacturing an internal mirror type gas laser tube, having a desired output power, in which a metallic member is disposed in the vicinity of a mirror within the internal mirror type gas laser tube and an electric discharge is excited between an anode of the laser tube and the disposed metallic member. The metallic member serves as a cathode to sputter the metal of the metallic member with positive ion bombardments so that the sputtered metal is deposited on the surface of the mirror to reduce the reflection rate of the mirror. Reflection rate is reduced until the laser output reaches the desired value.

The metallic member may be a double-finned metallic tube inserted between the mirror portion and the active portion of the laser tube and the metallic member may for adjustment of the mirror.

DETAILED DESCRIPTION OF A PREFERRED EMBODIMENT

Figure 1:
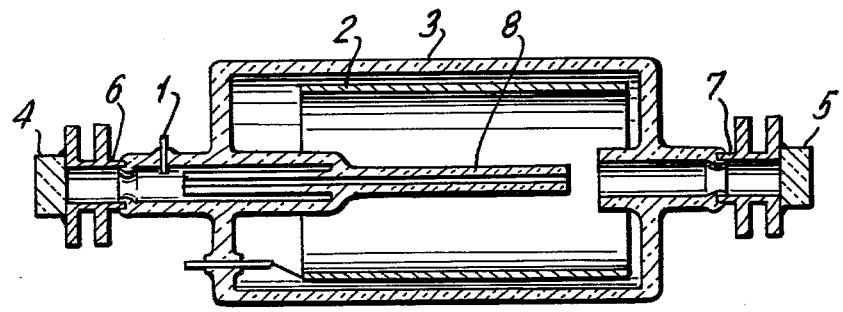
FIG. 1 is a longitudinal cross-sectional view of an internal mirror type gas-laser tube to be used in one embodiment of the present invention.

FIG. 1 shows an example of an internal mirror type gas laser tube to be used in one embodiment of the present invention. A gas laser tube of such a type is shown in U.S. Pat. No. 4,064,466. Referring to FIG. 1, the gas laser tube comprises a cathode 2 for inducing electron emission, an anode 1 for collecting the electrons, a capillary tube 8 for confining a plasma to form a laser active region, reflector mirrors 4 and 5 which form a resonator, metallic members 6 and 7 disposed in the vicinities of the reflector mirrors, and a glass envelope 3 in which a selected gas such as helium-neon is enclosed. The members 6 and 7 are made of metal which can be manually deformed and will retain the deformed shape. Representing metals are copper or nickel. Members 6 and 7 comprise tubes with two fins inserted between the mirrors 5 and the envelope 3, so that the members can function to adjust reflector mirrors 4 and 5 by subjecting the fins to plastic deformation.

Upon normal operation of the laser tube, an electric discharge is excited between anode 1 and cathode 2 through the capillary tube 8. Light emitted in the capillary tube is fed back by the reflector mirrors 4 and 5 to sustain laser oscillation.

Where a plurality of such laser tubes are produced on a massproduction basis, their outputs show fairly random variation. According to the present invention, laser tubes having a higher output than a predetermined rated output value are subjected to sputtering of the metal of one or both of the metallic members 6 and 7 within the laser tube onto the reflector mirror 4 and/or onto the output side reflector mirror 5 to give an optical loss. The optical loss is gradually increased until the output power of the laser tubes is reduced to the predetermined rated value.

In detail, the output power of the laser tubes is measured and, with respect to laser tubes having an output power larger than a predetermined output power, a negative voltage is applied to metallic member 7 disposed in the vicinity of the output reflector mirror 5. Member 7 becomes a temporary cathode, while a positive voltage is applied to anode 1 to thereby excite an electric discharge through the capillary tube 8 at the same discharge current as the normal laser operation. The metal of metallic member 7 is thereby sputtered by ion bombardments and adheres onto the surface of the reflector mirror 5 to form a metallic film. This metallic film serves to lower the reflection rate of the reflector mirror 5 which is coated with a multi-layered dielectric film and has a high reflection rate. This therefore increases the loss of the optical resonator. In this way, the sputtering of metal from metallic member 7 is continued until a predetermined rated output power is obtained. The resultant laser tube can naturally provide the predetermined rated output power when an electric discharge is excited between anode 1 and cathode 2 in normal operation and at a normal discharge current.

Figure 2:
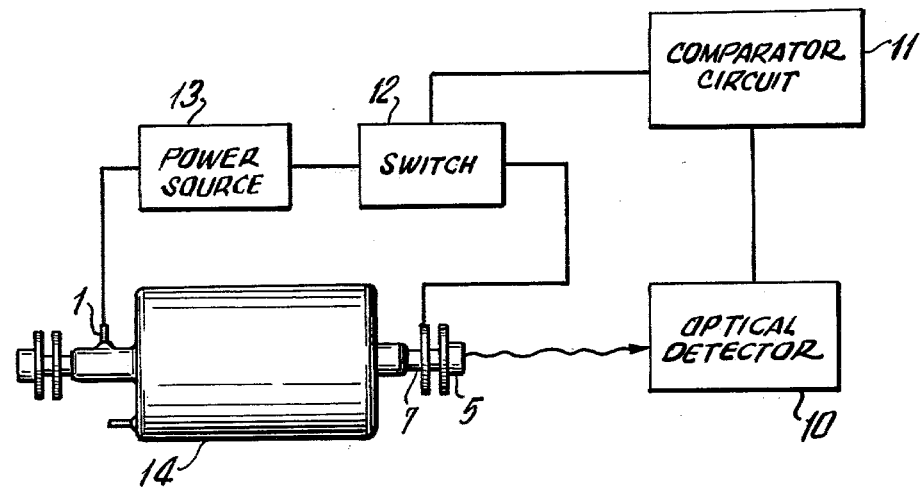
FIG. 2 is a schematic view of the laser tube of FIG. 1 with a block diagram of a circuit for achieving a reduction in output power in accordance with one embodiment of the present invention.

Shown in FIG. 2 is apparatus suitable for mass-producing laser tubes having a predetermined rated output in accordance with the instant invention. The apparatus which comprises, in addition to laser tube 14 shown in FIG. 1, an electric power supply 13 for exciting an electric discharge between metallic member 7 and anode 1, an optical detector 10, such as a solar cell for measuring laser output emitted from the output side reflector mirror 5, a comparator circuit 11, which compares the output power of the laser tube 14 with a given rated output and generates a control signal when the two outputs are in coincidence, and a switch 12 disconnecting the metallic member 7 from the power supply 13 to thereby stop the electric discharge in response to the control signal fed from the comparator circuit 11. The apparatus is regulated so that electric discharge may be excited at a discharge current of the same value as that of normal laser operation. In addition the electric discharge may be automatically stopped when the rated output has been attained.

In one example, a metallic member 7, made of nickel and being 5 mm in internal diameter and 9 mm in length, was disposed at a distance of approximately 250 mm from anode 1. For such a laser tube 14 having a laser output of about 1 mW, a discharge current of 3 mA was applied between the member 7 and the anode 1 for 10 minutes. As a result, a desired output power of 0.8 mW was obtained. The time necessary for sputtering deviated from 10 minutes to 60 minutes. This range may be based on differences in heat treatment in production of the metallic member 7.

Since the thus manufactured laser tubes can always provide a predetermined rated output, they do not require either a filter for attaining a constant output power nor means for holding the filter. Therefore, laser tubes constructed in accordance with the instant invention are simple in structure and less expensive.

In the above description, the metallic members disposed in the vicinity of the reflector mirrors have been described as having a mirror adjusting mechanism such as fins. However the present invention imposes no limitation on the configuration of the metallic members at all so long as the metallic members are disposed in the vicinity of at least one reflector mirror. For example, the metallic members may have a cylindrical shape or a bellows shape. Nickel, copper, brass, Covar or the like can be used as a material for the metallic members. In addition, it is obvious that since the object of the present invention can be achieved by merely employing the metallic member as a temporary cathode, besides the normal anode 1, the cathode 2 or the metallic member 6 could be used as a temporary anode for collecting electrons.

In addition, the configuration of the laser tube is not limited to the above-described one, provided that at least one metallic member is disposed in the vicinity of at least one reflector mirror.

It is also obvious that according to the present invention the same effect as described above can be obtained even when the sputtered metallic film is formed on the reflector mirror 4 on the opposite side from the optical output or when the sputtered metallic films are formed on both reflector mirrors 4 and 5.

Although a specific embodiment of this invention has been shown and described it will be understood that various modifications may be made without departing from the spirit of this invention.

What is claimed is:

1. A method of manufacturing an internal mirror type gas laser tube, said laser tube including an internal mirror and an internal anode, the method comprising the steps of, disposing a metallic member in the vicinity of the internal laser tube mirror, exciting an electric discharge by utilizing the internal laser tube anode and by employing said metallic member as a cathode to sputter the metal of said metallic member and to thereby form a metallic film on the surface of said internal mirror, said sputtered metal film reducing the reflection rate of the internal mirror to reduce the laser ouptut power to a predetermined value.

2. A method as claimed in claim 1, in which said metallic member has a finned configuration.

3. A method as claimed in claim 1 or 2, in which said metallic member is made of a metal selected from nickel, copper, and brass.

4. A method of manufacturing an internal mirror type gas laser tube comprising the steps of preparing an internal mirror type gas laser tube which has at least one metallic member in the vicinity of an internal laser mirror, measuring the output power of said gas laser, internally sputtering said metallic member to form a metallic film on said internal mirror and stopping the sputtering when the laser output power is reduced to a predetermined value.

* * * * *